(12) United States Patent
Drew et al.

(10) Patent No.: US 6,187,153 B1
(45) Date of Patent: Feb. 13, 2001

(54) COMPARATOR FOR MONITORING THE DEPOSITION OF AN ELECTRICALLY CONDUCTIVE MATERIAL ON A LEADFRAME TO WARN OF IMPROPER OPERATION OF A LEADFRAME ELECTROPLATING PROCESS

(75) Inventors: David M. Drew, Attleboro; Paul R. Moehle, Seekonk, both of MA (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/339,527

(22) Filed: Jun. 24, 1999

Related U.S. Application Data

(62) Division of application No. 08/931,698, filed on Sep. 16, 1997, now Pat. No. 6,019,886.

(51) Int. Cl.[7] .................................................. C25D 17/00
(52) U.S. Cl. .................. 204/228.1; 204/211; 204/229.8; 204/230.2
(58) Field of Search .............................. 204/228.1, 229.8, 204/230.2, 211; 205/81, 83

(56) References Cited

U.S. PATENT DOCUMENTS

| | | | |
|---|---|---|---|
| 4,090,928 | * | 5/1978 | Pantiga et al. ........................ 205/122 |
| 4,147,610 | * | 4/1979 | Larson ................................ 204/229.2 |
| 4,240,881 | * | 12/1980 | Stanya ...................................... 205/83 |
| 4,490,230 | * | 12/1984 | Fletcher .............................. 204/229.8 |
| 4,497,695 | * | 2/1985 | Shinkai et al. ........................... 205/83 |
| 4,545,876 | * | 10/1985 | McGivern, Jr. ......................... 205/83 |
| 4,699,694 | * | 10/1987 | Backelandt et al. .................... 205/83 |
| 5,728,285 | * | 3/1998 | Mathew ................................ 205/182 |

* cited by examiner

Primary Examiner—Kathryn Gorgos
Assistant Examiner—William T. Leader
(74) Attorney, Agent, or Firm—Jacqueline J. Garner; W. James Brady, III; Frederick J. Telecky, Jr.

(57) ABSTRACT

A method and circuit (14) for monitoring an electroplating operation of an electroplating machine (10) of the type having a first electroplating cell (18) for depositing nickel onto an integrated circuit leadframe (12) and a second electroplating cell (19) for subsequently depositing palladium onto the leadframe (12). A first current (30) is applied in the first electroplating cell (18) to form a nickel deposit on the leadframe (12) and a second current (31) is applied in the second electroplating cell (19) to from a palladium deposit on the nickel deposit. The second current (31) is greater than the first current (30) if the electroplating machine (10) is operating normally. The first current (30) and second current (31) are compared in a comparator (44) during the electroplating operation, and if the second current (31) is less than the first current (30), an error signal is generated on an output line (50). If desired, the electroplating machine (10) may be stopped in response to the error signal.

9 Claims, 1 Drawing Sheet

COMPARATOR FOR MONITORING THE DEPOSITION OF AN ELECTRICALLY CONDUCTIVE MATERIAL ON A LEADFRAME TO WARN OF IMPROPER OPERATION OF A LEADFRAME ELECTROPLATING PROCESS

This application is a divisional of application Ser. No. 08/931,698, filed Sep. 16, 1997, now U.S. Pat. No. 6,019,886.

BACKGROUND OF THE INVENTION

1. Field of the Invention

This invention relates to improvements in plating processes and equipment, and more particularly to improvements in methods and apparatuses for monitoring performance of plating apparatuses, particularly for use in plating palladium onto integrated circuit leadframes.

2. Relevant Background

Leadframes are electrically conducting structures that are used in the manufacture of packaged integrated circuit devices. Typically, a semiconductor chip is mounted onto or adjacent a leadframe, which includes a number of leads or conductors by which connections can be made to other circuitry, and the circuits of the chip are selectively connected to the leads. After the chip and leads are connected, a portion of the leadframe and the chip are encapsulated to form a package, usually of plastic, in which the chip is delivered and used.

In the construction of many leadframes, the leadframe may be coated with palladium to provide desired conductivity and other properties, and to facilitate the bonding of gold connection wires between the leadframe and the chip. The layer of palladium is a usually of importance to customers because the palladium plays an important part in enabling proper bonding of the gold wires that connect the chip to the leadframe and of enabling solid connections to be made to the leads of the leadframe in use.

However, in order to provide the desired palladium coating, multiple underlying coats are generally required. For example, on a copper leadframe, usually four conductive coats are successively electroplated onto the leadframe structure to assure the integrity of the top palladium layer. To assure that the palladium "sticks" and has the proper electrical characteristics, typically, the layer immediately below the palladium layer is nickel.

In most manufacturing processes, which are usually under computer control, however, failures in the computer system may go undetected for some time. This may result in production of potentially large lots of unacceptable leadframes. It may be, in fact, possible for defective product to be shipped to the customer, resulting in the subsequent production of parts which may not meet specifications and which may require expensive identification, correction, and substitution of proper parts.

To address these problems, frequently the production lines have been monitored by x-ray equipment, in which the thickness of the material being deposited is x-rayed. Such x-ray monitoring, however, requires manual operation, and also requires expensive equipment, which itself requires expensive regulation and maintenance.

What is needed, therefore, is a method and apparatus for monitoring the electroplating process so that if the conditions required for proper palladium electroplating become improper to form the desired palladium layer, an operator can be warned, or, optionally, the production line can be automatically shut down.

SUMMARY OF THE INVENTION

In light of the above, therefore, it is an object of the invention to provide a method and apparatus for monitoring the electroplating process which warns the operator, or, optionally, automatically shuts down the production line if the conditions required for proper palladium electroplating become improper to form the desired palladium layer.

It is another object of the invention to provide a method and apparatus of the type described, which can be used in conjunction with an electroplating line that is operated under computer control, and which operates independently of the computer and its control.

It is yet another object of the invention to provide a method and apparatus for monitoring the electroplating currents in an electroplating machine, wherein if a current in a palladium depositing cell falls below a current in a nickel depositing cell, a signal is generated, which may be used to stop the electroplating machine.

These and other objects, features and advantages of the invention will be apparent to those skilled in the art from the following detailed description of the invention, when read in conjunction with the accompanying drawings and appended claims.

The method and circuit of the invention uses electronic circuitry, which may be redundant to the a computer plating operating and monitoring system used in conjunction with a leadframe electroplating production line. The circuitry monitors a plating function in the process which has a known amperage to provide a reference current that can be compared to the amperage required in the palladium cell. For example, the reference cell may be a nickel strike head, which generally requires less current than the palladium cell, when operating on leadframes having the same surface area. The circuit compares the amperage in the palladium cell to the reference cell. If the amperage in the palladium head falls below the amperage of the nickel strike head, the line can be automatically shut down, or an alarm can be generated to warn the operator of a potentially failing condition.

Thus, according to a broad aspect of the invention, a method is presented for monitoring the operation of an electroplating machine of the type which has least two cells for depositing at least two different metals sequentially onto a substrate, which may be an integrated circuit leadframe, or the like. The method includes comparing a first electroplating current in a first one of the cells with a second electroplating current in a second one of the cells. If the electroplating machine is operating normally, the first current is less than the second current. If however, the second current is less than the first current, an error signal is generated. If desired, the method may also include stopping the electroplating machine in response to the error signal.

The method may also include conditioning the first and second signals prior to the comparing step to reduce effects of any common mode differences or ground loops. The step of comparing a first electroplating current in the first cell with a second electroplating current in the second cell comprises comparing a first electroplating current in a cell in which nickel is deposited with a second electroplating current in a cell in which palladium is deposited.

According to another broad aspect of the invention, a method for monitoring an electroplating operation of an electroplating machine is presented. The electroplating machine is of the type which has a first electroplating cell for depositing nickel onto an integrated circuit leadframe and a second electroplating cell for subsequently depositing palladium onto the leadframe. The method includes applying a first current to the first electroplating cell to form a nickel deposit on a leadframe substrate and applying a second current to the second electroplating cell to from a palladium deposit on the nickel deposit. The second current is greater than the first current if the electroplating machine in operating normally. The first current and second currents are compared during the electroplating operation, and if the second current is less than the first current, an error signal is generated. If desired, the electroplating machine may be stopped in response to the error signal.

According to yet another broad aspect of the invention, an electroplating machine is presented. The electroplating machine has a first cell for depositing a first metal onto a substrate, and a second cell for depositing a second metal onto the substrate. A first current generator applies a first current to the first cell during a first electroplating process, and a second current generator applies a second current to the second cell during a second electroplating process. The second current is larger than the first current during normal operation of the electroplating machine. A comparator is connected to compare a magnitude of the first current with a magnitude of the second current, to produce an output when the second current is less than the first current. Optionally, a circuit is provided for stopping the electroplating machine in response to an output from the comparator that indicates that the second current is less than the first current.

According to yet another broad aspect of the invention, an electroplating machine is presented for depositing nickel onto an integrated circuit leadframe in a first electroplating cell and for depositing palladium onto the integrated circuit leadframe in a second electroplating cell. The machine includes a first current generator to apply a first current to the first electroplating cell and a second current generator to apply a second current to the second electroplating cell. The second current is greater than the first current if the electroplating machine in operating normally. A comparator compares the first current and second currents, and produces an error signal output if the second current is less than the first current. If desired, the electroplating machine may include a circuit for stopping the electroplating machine in response to the output of the comparator.

BRIEF DESCRIPTION OF THE DRAWINGS

The invention is illustrated in the accompanying drawings, in which.

In the various figures of the drawing, like reference numerals are used to denote like or similar parts.

DETAILED DESCRIPTION OF THE PREFERRED EMBODIMENTS

It should be noted that the process steps and structures herein described do not necessarily form a complete process flow for manufacturing integrated circuits or parts thereof. It is anticipated that the present invention may be practiced in conjunction with integrated circuit and packaging fabrication techniques currently used in the art, and only so much of the commonly practiced process steps are included as are necessary for an understanding of the present invention.

Figure 1:
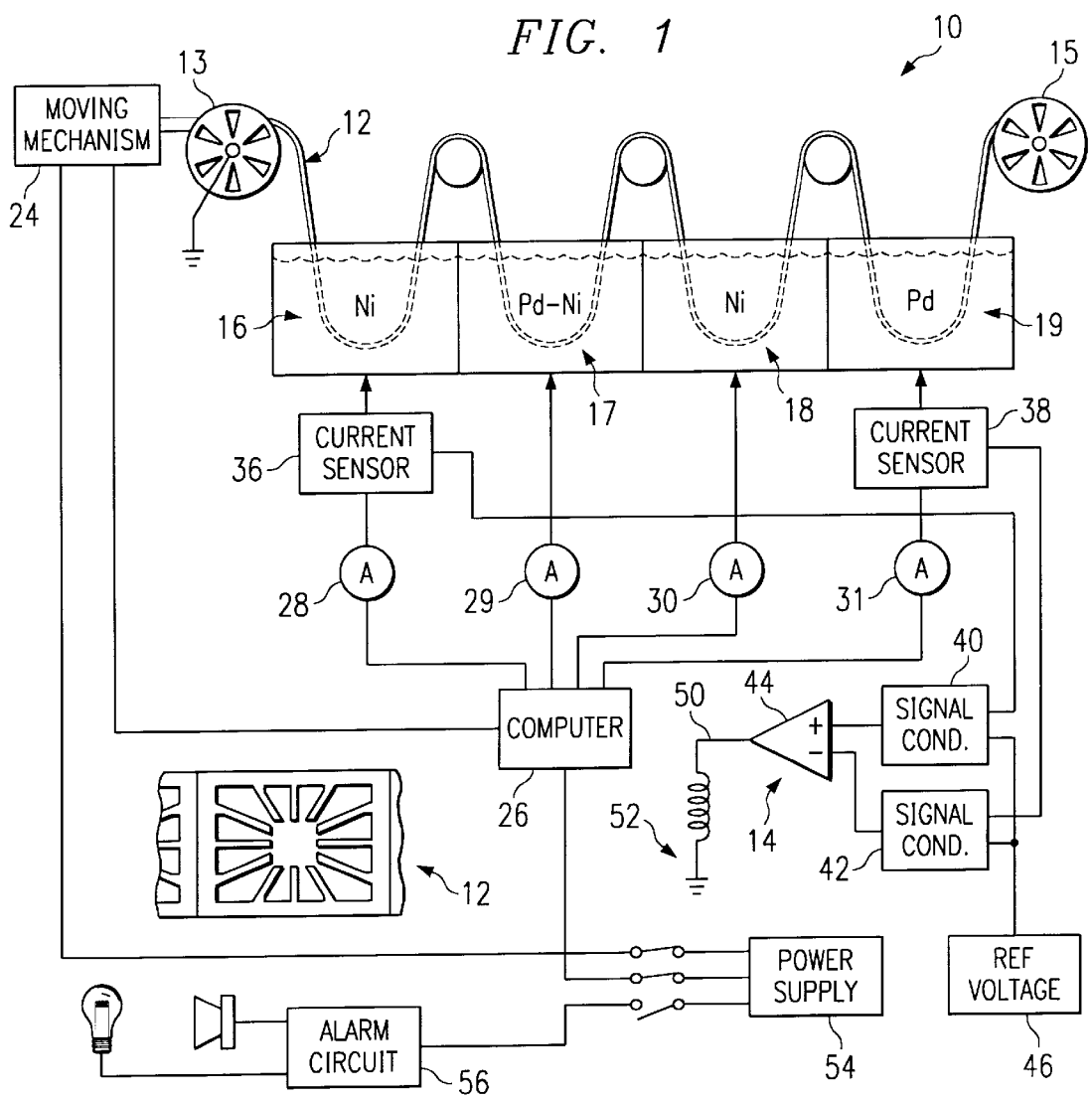
FIG. 1 is a diagrammatic illustration of a typical electroplating machine for electroplating various metals, including palladium, onto an integrated circuit leadframe, the machine including a circuit for monitoring the operation of the electroplating process of the machine, in accordance with a preferred embodiment of the invention.

Reference is first made to FIG. 1, which shows a diagrammatic illustration of a typical electroplating machine 10 for electroplating various metals, including palladium, onto an integrated circuit leadframe 12. According to the invention, a circuit 14 is included for monitoring the operation of the electroplating machine 10. The machine 10 includes a number of cells 16–19, in each of which a different material is electroplated onto the leadframes 12. The leadframes 12 are moved in a continuous sequence by a moving mechanism 24 from cell to cell 16–19, in known manner. The moving mechanism 24 is operated, for example, under the control of a programmed digital computer 26, or other appropriate controller, which also controls currents that flow in each respective ones of the cells 16–19 by current sources 28–31. In moving the leadframes 12 successively from cell to cell, preferably a continuous strip from which individual leadframes can be cut or separated is moved between supply 13 and take-up 15 reels. The continuous roll may be run on rollers through the successive cells 16–19, as shown, much as a film would be threaded in a projector. Thus, by varying the rate of movement of the leadframes 12 as they are moved through the cells 16–19, the time each leadframe spends in the respective electroplating solutions can be precisely controlled.

Figure 2:
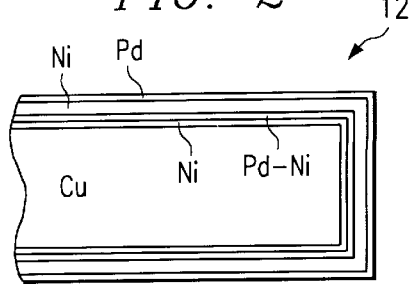
FIG. 2 is a side elevational cross sectional view of a portion of a leadframe, which has been coated with conductive layers of various materials, including palladium, according to the invention.

As shown, the leadframes 12 are sequentially plated in the electroplating solutions with a thin nickel strike, a nickel palladium layer, a thicker nickel layer, and a final thin palladium layer as they are moved from cell to cell 16–19. Although four electroplating cells are shown, any number of cells may be employed, as needed or as necessary. A side elevational cross sectional view of a portion of a completed leadframe, which has been coated with conductive layers of various materials, including a final layer of palladium is shown in FIG. 2.

To monitor the palladium deposition, according to a preferred embodiment of the invention, the electroplating currents supplied to the nickel and palladium cells 16 and 19 by respective current sources 28 and 31 may each include a current source rectifier (not shown) to provide the required plating amperage. From the current supplied by the current sources 28 and 31 and their respective plating rectifiers, analog voltages can be sensed or developed by current sensors 36 and 38 in the current flow paths to the respective nickel and palladium plating cells 16 and 19. The output from the current sensors 36 and 38 are proportional to the amperages being delivered to the plating cells.

If necessary, these voltages may be conditioned before they are compared, for example, to remove effects of common mode voltages and ground loops that may reduce the accuracy of the voltage measurement or sensing. Voltage conditioning is done by signal conditioning circuits 40 and 42. The signal conditioning circuits may be, for instance, accomplished using AC1360 devices, available from Keithley Metrabyte Company. After conditioning, the voltage signals from each current sensor 36 and 38 are compared in an comparator 44, which may be, for example, contained in a PLC, such as an IP3614 device, available from International Parallel Machine Company.

Figure 3:
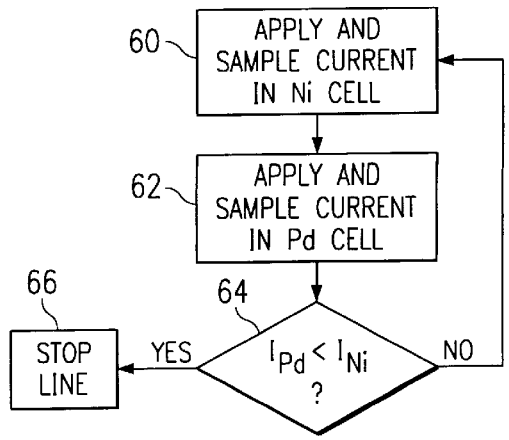
FIG. 3 is a flow diagram showing the steps in monitoring the operation of the electroplating machine of FIG. 1, in accordance with a preferred embodiment of the invention.

With reference additionally now to FIG. 3, the operation of the circuit 10 is described. In the normal operation of an electroplating machine of the type described, it is noted that the electroplating current that is applied from current source 30 to the nickel plating cell 18 is less than the current applied from the current source 31 to a palladium plating cell 19, for the same sized leadframe 12. Consequently, if a failure occurs in the system 10, or if the palladium material that is deposited on the leadframe becomes too thick, the magnitude of the current that is delivered to the palladium cell 19 falls below the magnitude of the current that is delivered to the nickel cell 18. The comparator, therefore, produces an output on line 50, which represents an error signal.

Thus, first as shown in box 60, a first electroplating current is applied to the nickel cell 18, and is sampled. As shown in box 62 second electroplating current is applied to the palladium cell, and is also sampled. It should be noted that in a continuous line in which both nickel and palladium cells are simultaneously in operation on leadframes of the same size moved from cell to cell down the production line, the currents to both cells may be simultaneously applied and sampled. On the other hand, if the line is of the type in which a single physical cell is used to operate on only one leadframe at a time, the current that is applied during a nickel deposition may be sampled and held for subsequent comparison to a current that is applied during a later palladium deposition.

The two sampled currents are then compared, diamond 64. If the palladium current is greater than the nickel current, the process is continually repeated. On the other hand, if the palladium current is less than the nickel current, the comparator 44 generates an error signal on line 50 the production line is stopped, box 66.

If it is desired that the production line be stopped in the presence of an error signal, the output line 50 from the comparator 44 may be connected to a relay, such as the relay 52 shown, to interrupt the power from a power supply 54 to the computer and to the moving mechanism 24, to shut down the system. Alternatively, the relay 52 may activate an alarm system 56 to alert an operator of the malfunction in the system 10.

It should be noted that at startup, if a new leadframe containing strip is introduced into the electrodeposition solutions of the cells 16–19, initially the current in the palladium cell 19 may be smaller than that of the nickel cell 16, until the properly processed leadframe travels to the palladium cell 19. Thus, an initial timer (not shown) may be provided to hold the monitor circuit 14 off until after a predetermined time, such as two minutes, or other appropriate time, has elapsed. Such timer may conveniently be provided as a function of the PLC from which the comparator circuit 44 is configured, as mentioned above. Alternatively, a piece of "scrap" leadframe material may be used as an initializing condition in which the scrap is allowed to extend sequentially through each of the cells 16–19.

There are several advantages which may realized by the circuit of invention. For example, since the monitoring circuit is not computer based, problems which may cause the operating computer to fail, freeze, or to enter an over ride state do not affect the operation or reliability of the circuit. Since the monitoring circuit is independent of the existing computer system, redundancy is added to the system. Also, since the monitoring circuit monitors existing conditions which follow consistent rules (such as the nickel strike current being less than the palladium strike current), no input from operations need to take place. Finally, the monitoring circuit may be designed to shut down the line, if desired, if the system fails.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. An electroplating machine comprising:
   a first cell for depositing a first conductive material onto a substrate;
   a second cell for depositing a second conductive material onto said substrate;
   a current generator for applying a first current to said first cell during a first electroplating process;
   a current generator for applying a second current to said second cell during a second electroplating process, said second current being larger than said first current during normal operation of the electroplating machine;
   a comparator connected to compare a magnitude of said first current with a magnitude of said second current for producing an output when said second current is less than said first current.

2. The electroplating machine claim 1 further comprising a circuit for stopping said electroplating machine in response to an output from said comparator that indicates that said second current is less than said first current.

3. The electroplating machine claim 1 further comprising a signal conditioning circuit to condition said first and second currents prior to said comparator.

4. The electroplating machine claim 1 wherein said substrate is an integrated circuit leadframe.

5. The electroplating machine claim 1 wherein said first conductive material is nickel and said second conductive material is palladium.

6. An electroplating machine for depositing nickel onto an integrated circuit leadframe in a first electroplating cell and for depositing palladium onto the integrated circuit leadframe in a second electroplating cell, comprising:
   a first current generator to apply a first current to said first electroplating cell;
   a second current generator to apply a second current to said second electroplating cell, said second current being greater than said first current if said electroplating machine is operating normally;
   a comparator for comparing said first current and second current, and if said second current is less than said first current, generating an error signal.

7. The electroplating machine of claim 6 further comprising a circuit for stopping said electroplating machine in response to said error signal.

8. The electroplating machine of claim 6 further comprising a sampling signal generator for generating sampling signals that indicate respective magnitudes of said first and second currents.

9. The electroplating machine of claim 6 further comprising a signal conditioner to condition said sampled signals.

* * * * *